United States Patent
Vos

(10) Patent No.: US 8,040,329 B2
(45) Date of Patent: Oct. 18, 2011

(54) FREQUENCY CONTROL CIRCUIT FOR TUNING A RESONANT CIRCUIT OF AN UNTETHERED DEVICE

(75) Inventor: Martin J. Vos, Minneapolis, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 1124 days.

(21) Appl. No.: 11/613,554

(22) Filed: Dec. 20, 2006

(65) Prior Publication Data

US 2008/0150658 A1    Jun. 26, 2008

(51) Int. Cl.
G06F 3/033 (2006.01)
(52) U.S. Cl. ..... 345/179; 345/174; 345/173; 178/19.03; 178/19.01
(58) Field of Classification Search ............... 345/174, 345/173, 179; 178/19.01, 19.03
See application file for complete search history.

(56) References Cited

U.S. PATENT DOCUMENTS

| | | | |
|---|---|---|---|
| 3,072,849 A * | 1/1963 | Firestone | ............. 455/250.1 |
| 3,617,922 A * | 11/1971 | Bernstein | ................... 331/1 R |
| 3,983,322 A | 9/1976 | Rodgers | |
| 4,029,869 A | 6/1977 | Ingram et al. | |
| 4,289,926 A | 9/1981 | Kobayashi | |
| 4,289,927 A | 9/1981 | Rodgers | |
| 4,353,552 A | 10/1982 | Pepper | |
| 4,360,790 A * | 11/1982 | Heise | ...................... 331/114 |
| 4,455,451 A | 6/1984 | Kriz | |
| 4,473,717 A | 9/1984 | Parnell et al. | |
| 4,672,154 A | 6/1987 | Rodgers et al. | |
| 4,686,332 A | 8/1987 | Greanias et al. | |
| 4,786,765 A | 11/1988 | Yamanami et al. | |
| 4,848,469 A | 7/1989 | Murakami et al. | |
| 4,878,553 A | 11/1989 | Yamanami et al. | |
| 4,893,115 A | 1/1990 | Blanchard | |
| 4,902,858 A | 2/1990 | Yamanami et al. | |
| 4,948,926 A | 8/1990 | Murakami et al. | |

(Continued)

FOREIGN PATENT DOCUMENTS

CN           1512345           7/2004

(Continued)

OTHER PUBLICATIONS

U.S. Appl. No. 11/557,829, entitled "Touch Location Sensing System and Method Employing Sensor Data Fitting to a Predefined Curve," filed on Nov. 8, 2006.

(Continued)

*Primary Examiner* — Richard Hjerpe
*Assistant Examiner* — Dorothy Harris
(74) *Attorney, Agent, or Firm* — Steven A. Bern

(57) ABSTRACT

An untethered device, configured to inductively couple to a source device, includes a tunable resonant circuit having a resonance frequency and configured to generate a supply voltage for the untethered device in response to a varying magnetic field produced by the source device. The tunable resonant circuit includes an inductive coil comprising a center tap and a capacitive circuit coupled to the inductive coil. The capacitive circuit includes an anti-series arrangement of varactor diodes that behave as a capacitance when placed in reverse bias. A frequency control circuit is coupled to the tunable resonant circuit and includes a control voltage source coupled to the center tap of the inductive coil. The control voltage source produces a control signal to place the varactor diodes in reverse bias and to change the capacitance of the capacitive circuit, thereby effecting a change in the resonance frequency of the tunable resonant circuit.

17 Claims, 8 Drawing Sheets

U.S. PATENT DOCUMENTS

| | | | |
|---|---|---|---|
| 4,956,526 A | 9/1990 | Murakami et al. | |
| 4,988,837 A | 1/1991 | Murakami et al. | |
| 4,999,461 A | 3/1991 | Murakami et al. | |
| 5,028,745 A | 7/1991 | Yamanami et al. | |
| RE33,740 E | 11/1991 | Taguchi et al. | |
| RE33,805 E | 1/1992 | Yamanami et al. | |
| 5,083,118 A | 1/1992 | Kazama | |
| 5,122,623 A | 6/1992 | Zank et al. | |
| 5,130,500 A | 7/1992 | Murakami et al. | |
| 5,138,118 A | 8/1992 | Russell | |
| RE34,187 E * | 3/1993 | Yamanami et al. | 178/18.07 |
| 5,191,175 A | 3/1993 | Protheroe et al. | |
| 5,194,819 A | 3/1993 | Briefer | |
| 5,218,173 A | 6/1993 | Garwin et al. | |
| 5,218,174 A | 6/1993 | Gray et al. | |
| 5,305,017 A | 4/1994 | Gerpheide | |
| 5,337,040 A | 8/1994 | Kind | |
| 5,369,227 A | 11/1994 | Stone | |
| 5,373,118 A | 12/1994 | Watson | |
| 5,374,787 A | 12/1994 | Miller | |
| 5,381,137 A | 1/1995 | Ghaem et al. | |
| 5,402,151 A | 3/1995 | Duwaer | |
| 5,414,227 A | 5/1995 | Schubert et al. | |
| 5,420,379 A | 5/1995 | Zank et al. | |
| 5,420,804 A | 5/1995 | Tanaka et al. | |
| 5,475,401 A | 12/1995 | Verrier et al. | |
| 5,486,847 A | 1/1996 | Ranf et al. | |
| 5,506,375 A | 4/1996 | Kikuchi | |
| 5,528,002 A | 6/1996 | Katabami | |
| 5,530,210 A | 6/1996 | Fukuzaki | |
| 5,557,076 A | 9/1996 | Wieczorek et al. | |
| 5,565,658 A | 10/1996 | Gerpheide et al. | |
| 5,571,997 A | 11/1996 | Gray et al. | |
| 5,594,215 A | 1/1997 | Jeng | |
| 5,608,390 A | 3/1997 | Gasparik | |
| 5,619,431 A | 4/1997 | Oda | |
| 5,629,500 A | 5/1997 | Fukuzaki et al. | |
| 5,633,471 A | 5/1997 | Fukushima | |
| 5,644,108 A | 7/1997 | Katsurahira et al. | |
| 5,661,269 A | 8/1997 | Fukuzaki et al. | |
| 5,675,130 A | 10/1997 | Sekizawa | |
| 5,682,019 A | 10/1997 | Katsurahira et al. | |
| 5,691,512 A | 11/1997 | Obi | |
| 5,691,513 A | 11/1997 | Yamamoto et al. | |
| 5,693,914 A | 12/1997 | Ogawa | |
| 5,706,000 A | 1/1998 | Fukuzaki et al. | |
| 5,714,984 A | 2/1998 | Fukuzaki et al. | |
| 5,730,165 A | 3/1998 | Philipp | |
| 5,748,110 A | 5/1998 | Sekizawa et al. | |
| 5,751,229 A | 5/1998 | Funahashi | |
| 5,763,839 A | 6/1998 | Funahashi et al. | |
| 5,790,106 A | 8/1998 | Hirano | |
| 5,792,997 A | 8/1998 | Fukuzaki | |
| 5,793,360 A | 8/1998 | Fleck et al. | |
| 5,815,091 A | 9/1998 | Dames et al. | |
| 5,861,583 A | 1/1999 | Schediwy et al. | |
| 5,898,136 A | 4/1999 | Katsurahira | |
| 5,914,708 A | 6/1999 | LaGrange et al. | |
| 5,914,710 A | 6/1999 | Chen et al. | |
| 5,945,980 A | 8/1999 | Moissev et al. | |
| 5,973,677 A | 10/1999 | Gibbons | |
| 5,986,646 A | 11/1999 | Chen et al. | |
| 6,002,387 A | 12/1999 | Ronkka et al. | |
| 6,005,555 A | 12/1999 | Katsurahira et al. | |
| 6,020,849 A | 2/2000 | Fukuzaki | |
| 6,064,374 A | 5/2000 | Fukuzaki | |
| 6,075,468 A | 6/2000 | Sugiyama | |
| 6,118,435 A | 9/2000 | Fujita et al. | |
| 6,133,906 A | 10/2000 | Geaghan | |
| 6,137,427 A | 10/2000 | Binstead | |
| 6,178,818 B1 | 1/2001 | Plochinger | |
| 6,215,476 B1 | 4/2001 | Depew et al. | |
| 6,249,234 B1 | 6/2001 | Ely et al. | |
| 6,307,385 B1 | 10/2001 | Tardif et al. | |
| 6,335,727 B1 | 1/2002 | Morishita et al. | |
| 6,380,931 B1 | 4/2002 | Gillespie et al. | |
| 6,433,781 B1 | 8/2002 | Oda et al. | |
| 6,466,036 B1 | 10/2002 | Philipp | |
| 6,476,799 B1 | 11/2002 | Lee et al. | |
| 6,546,107 B1 | 4/2003 | Bohnke | |
| 6,549,096 B2 * | 4/2003 | Groves et al. | 333/174 |
| 6,576,850 B2 | 6/2003 | Fukushima et al. | |
| 6,587,098 B2 | 7/2003 | Teterwak | |
| RE38,286 E | 10/2003 | Flowers | |
| 6,667,740 B2 | 12/2003 | Ely et al. | |
| 6,670,561 B2 | 12/2003 | Aoki | |
| 6,690,156 B1 | 2/2004 | Weiner et al. | |
| 6,762,752 B2 | 7/2004 | Perski et al. | |
| 6,790,160 B2 | 9/2004 | Kato et al. | |
| 6,927,762 B2 | 8/2005 | Lin | |
| 6,970,160 B2 | 11/2005 | Mulligan et al. | |
| 7,019,672 B2 | 3/2006 | Ely | |
| 7,030,782 B2 | 4/2006 | Ely et al. | |
| 7,079,118 B2 | 7/2006 | Benard et al. | |
| 7,241,954 B2 | 7/2007 | Kanai | |
| 7,265,303 B2 | 9/2007 | Thacker | |
| 7,411,584 B2 | 8/2008 | Hill et al. | |
| 7,436,164 B2 * | 10/2008 | Vos | 323/293 |
| 7,453,444 B2 | 11/2008 | Geaghan | |
| 7,474,300 B2 | 1/2009 | Katsurahira et al. | |
| 7,787,259 B2 | 8/2010 | Free et al. | |
| 7,812,268 B2 | 10/2010 | Ely | |
| 7,907,130 B2 | 3/2011 | Ely | |
| 2002/0050983 A1 | 5/2002 | Liu et al. | |
| 2003/0001692 A1 * | 1/2003 | Chiu et al. | 333/164 |
| 2003/0067447 A1 | 4/2003 | Geaghan et al. | |
| 2003/0090347 A1 * | 5/2003 | Losehand et al. | 334/15 |
| 2004/0004488 A1 | 1/2004 | Baxter | |
| 2004/0092229 A1 | 5/2004 | Hessel | |
| 2004/0095333 A1 | 5/2004 | Morag et al. | |
| 2004/0104826 A1 | 6/2004 | Philipp | |
| 2004/0155871 A1 | 8/2004 | Perski et al. | |
| 2004/0233178 A1 | 11/2004 | Silk et al. | |
| 2005/0083307 A1 | 4/2005 | Aufderheide et al. | |
| 2005/0099188 A1 | 5/2005 | Baxter | |
| 2005/0128191 A1 | 6/2005 | Katsurahira et al. | |
| 2005/0146513 A1 | 7/2005 | Hill et al. | |
| 2005/0162411 A1 | 7/2005 | Berkel van | |
| 2005/0171714 A1 | 8/2005 | Ely et al. | |
| 2005/0174259 A1 | 8/2005 | Ely | |
| 2006/0016800 A1 | 1/2006 | Paradiso et al. | |
| 2006/0022959 A1 | 2/2006 | Geaghan | |
| 2006/0038628 A1 * | 2/2006 | Khannur | 331/177 V |
| 2006/0114247 A1 | 6/2006 | Brown | |
| 2006/0125472 A1 | 6/2006 | Howard et al. | |
| 2007/0164833 A1 * | 7/2007 | Kottschlag | 331/177 V |
| 2008/0106520 A1 | 5/2008 | Free et al. | |
| 2008/0116990 A1 | 5/2008 | Rokhsaz | |
| 2008/0128180 A1 | 6/2008 | Perski et al. | |
| 2008/0142281 A1 | 6/2008 | Geaghan | |
| 2008/0149401 A1 | 6/2008 | Hagen et al. | |
| 2008/0149402 A1 | 6/2008 | Vos | |
| 2008/0150550 A1 | 6/2008 | Vos | |
| 2008/0150917 A1 | 6/2008 | Libbey et al. | |
| 2008/0150918 A1 | 6/2008 | Hagen et al. | |
| 2008/0156546 A1 | 7/2008 | Hauck | |
| 2008/0158165 A1 | 7/2008 | Geaghan et al. | |
| 2008/0158848 A1 | 7/2008 | Free et al. | |
| 2009/0040193 A1 | 2/2009 | Geaghan | |
| 2009/0134960 A1 | 5/2009 | Larson et al. | |
| 2010/0188832 A1 | 7/2010 | Free et al. | |

FOREIGN PATENT DOCUMENTS

| | | |
|---|---|---|
| DE | 33 42 522 | 6/1985 |
| DE | 298 19 250 | 1/2000 |
| EP | 0 549 956 | 7/1993 |
| EP | 0 607 694 B1 | 3/2000 |
| JP | 59-014043 | 1/1984 |
| JP | 07319601 | 12/1995 |
| JP | 08-179871 | 7/1996 |
| JP | 09-046135 | 2/1997 |
| JP | 10-011206 | 1/1998 |
| JP | 11-024830 | 1/1999 |
| JP | 11-073270 | 3/1999 |
| JP | 11-249798 | 9/1999 |
| JP | 2002-007054 | 1/2002 |
| JP | 2002-297300 | 10/2002 |

| | | |
|---|---|---|
| JP | 2004-062729 | 2/2004 |
| JP | 2004-185153 | 7/2004 |
| KR | 10-0601151 B1 | 7/2006 |
| KR | 10-0601152 B1 | 7/2006 |
| WO | WO 92/08206 | 5/1992 |
| WO | WO 93/08551 | 4/1993 |
| WO | WO 96/18171 | 6/1996 |
| WO | WO 02/103622 | 12/2002 |
| WO | WO 2004/021328 A2 | 3/2004 |
| WO | WO 2004/036147 | 4/2004 |
| WO | WO 2004/040240 A1 | 5/2004 |
| WO | WO 2004/070396 A2 | 8/2004 |
| WO | WO 2006133159 A2 * | 12/2006 |

OTHER PUBLICATIONS

Paul Lorrain and Dale Carson, *Electromagnetic Fields and Waves*, 2d ed. W.H. Freeman and Company of San Francisco, CA (1970), pp. 150-152.

* cited by examiner

FREQUENCY CONTROL CIRCUIT FOR TUNING A RESONANT CIRCUIT OF AN UNTETHERED DEVICE

The present invention relates generally to communication between an untethered device and a sensing system and, more particularly, to sensing systems and methods that employ an untethered stylus as a user input implement.

BACKGROUND

Personal computing systems of varying type and configuration typically provide one or more user interface devices to facilitate user interaction with such computing systems. Well known user interface devices include a keyboard, mouse, trackball, joystick, and the like. Various types of personal computing devices, such as tablet PCs, provide a pen apparatus that can be manipulated by the user, much in the same way as a pencil or ink pen.

Conventional computing devices that provide for user input via a pen or other pointer implement typically employ an electromagnetic inductive system. The electromagnetic inductive system usually comprises an electromagnetic pen or pointer apparatus and a digitizer in the form of a tablet. Changes in pen location relative to the digitizer's sensing surface are detected and location computations are made to determine the coordinates of the pen.

SUMMARY OF THE INVENTION

The present invention is directed to systems and methods for enhancing communication between an untethered device and a sensing system. According to embodiments of the present invention, an untethered device is configured to inductively couple to a source device. The source device is configured to generate a varying magnetic field having a fixed frequency. The untethered device includes a tunable resonant circuit having a resonance frequency and configured to generate a supply voltage for the untethered device in response to the varying magnetic field. The tunable resonant circuit includes an inductive coil comprising a center tap and a capacitive circuit coupled to the inductive coil.

The capacitive circuit includes an anti-series arrangement of varactor diodes that behave as a capacitance when placed in reverse bias. A frequency control circuit is coupled to the tunable resonant circuit and includes a control voltage source coupled to the center tap of the inductive coil. The control voltage source produces a control signal to place the varactor diodes in reverse bias and to change the capacitance of the capacitive circuit, thereby effecting a change in the resonance frequency of the tunable resonant circuit.

The anti-series arrangement of varactor diodes preferably provides for a total capacitance, $C_t$, that is substantially AC voltage amplitude independent except for a second order effect. The control signal produced by the control voltage source preferably changes the capacitance of the capacitive circuit so that the resonance frequency of the tunable resonant circuit is tuned to the fixed frequency of the magnetic field.

The inductive coil includes first and second contacts at respective first and second ends of the inductive coil. A first varactor diode arrangement is preferably coupled between the first end of the inductive coil and ground. A second varactor diode arrangement is preferably coupled between the second end of the inductive coil and ground. In some implementations, each of the first and second varactor diode arrangements includes a multiplicity of varactor diodes. For example, each of the first and second varactor diode arrangements may include a multiplicity of parallel connected varactor diodes.

In some implementations, the control voltage source may include an operational amplifier having a negative input, a positive input, and an output. The output of the operational amplifier may be coupled to the center tap of the inductive coil. The positive input of the operational amplifier may be coupled to ground, and the negative input of the operational amplifier may be coupled to voltage source circuitry.

In other implementations, the positive input of the operational amplifier may be coupled to ground, and the negative input of the operational amplifier may be coupled to a first voltage source and a second voltage source. The first voltage source may provide a bias voltage and the second voltage source may provide a slowly varying AC voltage relative to the resonance frequency of the tunable resonant circuit.

In accordance with other embodiments, methods of the present invention may be implemented involving an untethered device configured to inductively couple to a source device, the source device configured to generate a varying magnetic field having a fixed frequency. Methods of the present invention may involve generating, by a tunable resonant circuit of the untethered device, a supply voltage for the untethered device in response to the varying magnetic field. The tunable resonant circuit may include an inductive coil coupled to a capacitive circuit, the capacitive circuit comprising an anti-series arrangement of varactor diodes that behave as a capacitance when placed in reverse bias.

Methods of the invention may further involve producing a control signal and applying the control signal to a center tap of the inductive coil to place the varactor diodes in reverse bias and to change the capacitance of the capacitive circuit, thereby effecting a change in the resonance frequency of the tunable resonant circuit. The anti-series arrangement of varactor diodes preferably provides for a total capacitance, $C_t$, that is substantially AC voltage amplitude independent except for a second order effect.

Producing the control signal may involve receiving first and second voltage signals and producing the control signal using the first and second voltage signals. The first voltage signal may be a bias voltage and the second voltage signal may be a slowly varying AC voltage relative to the resonance frequency of the tunable resonant circuit.

Changing the capacitance of the capacitive circuit is preferably effected using the control signal. For example, changing the capacitance of the capacitive circuit may be effected using the control signal so that the resonance frequency of the tunable resonant circuit is tuned to the fixed frequency of the magnetic field.

In various embodiments, the source device may include an RFID reader and the untethered device may include an RFID tag. In other embodiments, the source device includes a digitizer and the untethered device is configured as a stylus.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1:
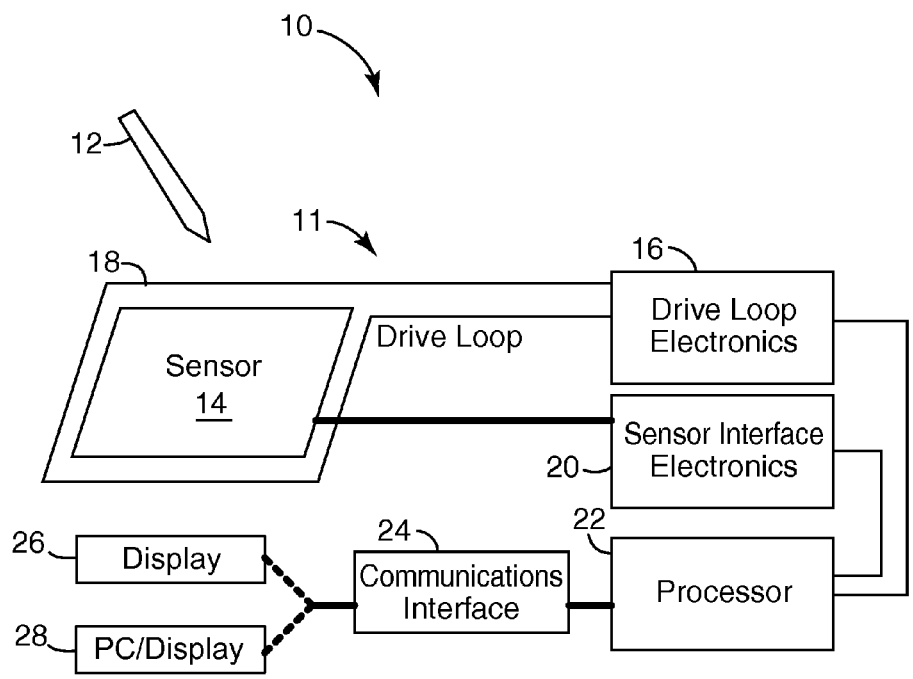
FIG. 1 is a diagram of a location sensing system that includes an untethered stylus and a location sensing device in accordance with embodiments of the present invention.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF EMBODIMENTS

In the following description of the illustrated embodiments, reference is made to the accompanying drawings which form a part hereof, and in which is shown by way of illustration, various embodiments in which the invention may be practiced. It is to be understood that the embodiments may be utilized and structural changes may be made without departing from the scope of the present invention.

The present invention is directed to methods and systems for effecting communication between an untethered device and a sensing system. Embodiments of the present invention provide for enhanced communication of information, such as analog and/or digital information, between the untethered device and the sensing system. Exemplary embodiments of the untethered device include a stylus or RFID (Radio Frequency Identification) tag. Exemplary embodiments of the sensing system include a device locating sensor or touch location sensor, such as a digitizer, or a RFID reader. Other examples of untethered devices include game pieces that interact with a game board or other structure that incorporates a sensing system. It is understood that methods and systems in accordance with the present invention may be implemented in a wide range of devices and systems other than those particularly described herein.

Embodiments of the present invention are directed to tuning of resonant circuitry provided at an untethered device, such as a stylus or RFID tag. Implementations of such embodiments provide for optimal continuous tuning of resonant circuitry in an untethered device, such as by extracting an error control signal that can be used in a feedback mechanism to self-tune the resonance frequency of inductive-capacitive circuits. In this manner, the need for time consuming hand tuning of individual circuits at the manufacturing level is eliminated, and optimal performance under varying external conditions, such as temperature, is achieved.

Other embodiments of the present invention are directed to controlling the resonance frequency of LC circuits in an untethered device using a control voltage to change the capacitance, C, of this LC circuit. An automatic mechanism using feedback according to such embodiments provides for precise and continuous tuning of the capacitor value, C, in order to ensure optimal circuit performance. Such a mechanism obviates time consuming and expensive manual tuning of component values and subsequent detuning because of slowly changing conditions.

According to further embodiments of the present invention, methodologies provide for self-tuning the frequency of a source device, so as to optimize an induced voltage over a capacitor in an LC circuit of an untethered device. Such embodiments provide methodologies for self-tuning the frequency of a driver that inductively couples to the LC circuit of an untethered device so that a maximum voltage is developed over the capacitor C in the LC circuit.

Figure 2:
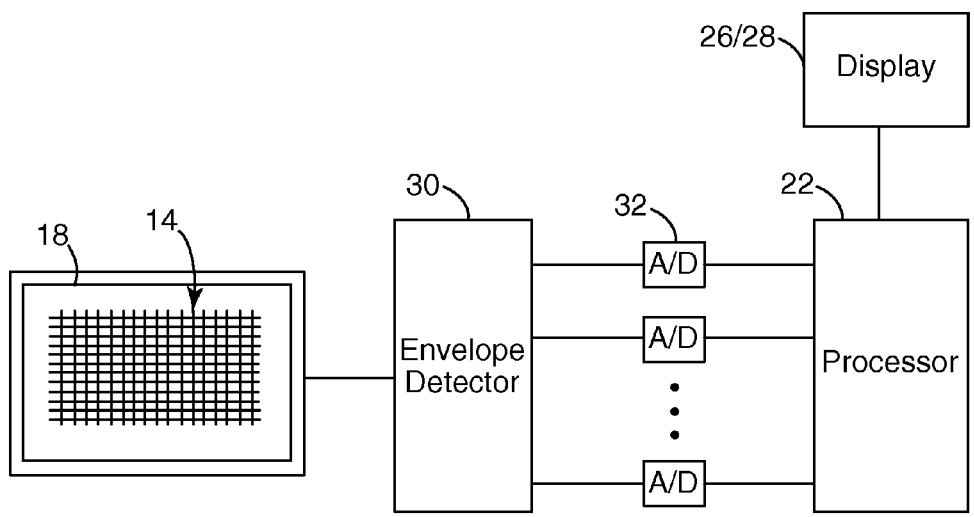
FIG. 2 is a diagram of various components of a location sensing device that cooperates with a stylus in accordance with embodiments of the present invention.
Figure 3:
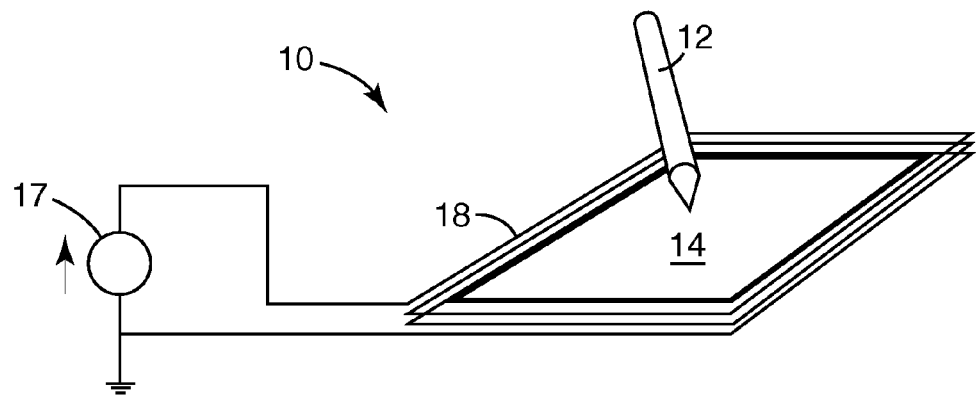
FIG. 3 is a diagram of an apparatus for generating an excitation magnetic field which is received by a stylus in accordance with embodiments of the present invention.

Embodiments of an untethered stylus of the present invention may be implemented in the context of a location sensing system, embodiments of which are illustrated in FIGS. 1-3. According to the embodiments shown in FIGS. 1-3, a location sensing system 10 includes a stylus 12 that interacts with a sensing device 11. The sensing device 11 includes a location sensor 14, such as a digitizer. The stylus 12 is preferably configured as a tetherless or cordless implement that does not have a battery. Rather, the stylus 12 derives power from a magnetic field generated by the sensing device 11. Although preferred embodiments of an untethered stylus do not include a battery, some embodiments may employ a battery, such as a rechargeable battery that is recharged from energy derived from the magnetic field of the drive signal. A battery may be used to provide power to various circuits of the stylus, such as a modulator or pressure sensor (e.g., tip or eraser pressure sensor).

The sensing device 11 is shown to include a drive loop or coil 18 coupled to drive loop electronics 16 that cooperate to generate a magnetic field, which may be a continuously varying magnetic field. Drive coil 18 may comprise one or more coils or loops. The stylus 12, having derived power from the magnetic field emanating from the drive coil 18, broadcasts a signal from which stylus location and status may be determined by the sensing device 11.

The stylus 12 is preferably configured to include one or more user-actuatable buttons or switches, such as those commonly employed to implement various mouse functions (e.g., right and left mouse buttons). The tip of the stylus 12 may incorporate a pressure sensor from which applied pressure can be resolved and transmitted to the sensing device 11. Eraser functionality may also be incorporated in the form of a switch or pressure sensor at the stylus end opposite the tip.

Sensor interface electronics 20 is coupled to the sensor 14 and facilitates measurement of signals developed at the sensor 14 in response to signals broadcast by the stylus 12. According to one configuration, the sensor 14 includes a digitizer that incorporates a detection grid and electronics as is known in the art. For example, such a detection grid may include pairs of position resolving conductors each of which forms one or more differential coil elements in the sensor 14, with each conductor pair receiving a magnetic signal transmitted by the stylus 14. An illustrative example of a digitizer having such a detection grid configuration, elements of which may be employed in a location sensor system of the present invention, is disclosed in U.S. Pat. Nos. 4,786,765; 5,218,174; 5,633,471; 5,793,360; 6,667,740; and 7,019,672; which are hereby incorporated herein by reference.

According to another configuration, the sensing device 11 may incorporate a sensor 14 that effectively incorporates a digitizer and a touch-sensitive sensor. The digitizer, according to this configuration, allows the location and status of the stylus 12 to be determined. The touch-sensitive sensor allows the location of a finger touch to be determined. This configuration allows a user to use either the stylus 12 or a finger to indicate a desired location on a computer display, as well as determine the location and status of the stylus 12.

The touch-sensitive sensor 14 typically includes a matrix that capacitively couples to the stylus 12 and/or a finger. In this configuration, the sensor 14 of the sensing device 11 is preferably made up of a series of transparent conductors placed upon a glass or plastic cover that can be placed in front of an LCD display. One side of the glass or plastic sheet has conductors in the X direction, and the opposite side has conductors in the Y direction. Examples of suitable touch sensitive sensors 14 are disclosed in commonly owned U.S. Pat. Nos. 6,133,906 and 6,970,160, in commonly owned U.S. Published Application No. 2005/0083307, in U.S. Pat. Nos. 6,762,752 and 6,690,156, and in U.S. Published Application No. 2004/0095333, each of which is hereby incorporated herein by reference.

An embodiment that incorporates a digitizer and touch-sensitive sensor advantageously allows a user to point a stylus at a computer display and have the location and status of the pointing device determined and, when a finger is used to point at the display device, allows for the determination of the location of a finger touch at the display device. The dual use aspects of this embodiment of a sensing device 11 make it particularly useful in tablet PC applications.

For example, a digitizer arrangement allows a user to use a stylus to input information, indicate operations the user wants to take, and write or draw on the display. The touch-sensitive sensor allows the user to "type" information onto a virtual keyboard on the display screen, for example. This would allow the vendor of the computing system, in which a dual touch location sensor system of the present invention is implemented, to eliminate the keyboard and the associated bulk it requires. It is understood that a digitizer and a touch-sensitive sensor need not be implemented together in all configurations, but inclusion of both sensing devices provides for enhanced user interaction with a computing system that incorporates a sensing system 10 of the present invention.

According to one embodiment, the drive coil 18 may be constructed of wire, such as 36 gauge wire, looped several times (e.g., 4 times) around the periphery of the frame of sensing device 11. In one implementation, the drive coil 18 may have an inductance of about 21 µH and an impedance of about 14 Ohms at 100 kHz. The drive coil 18 is connected to a signal generator of the drive loop electronics 16. The signal generator may be configured to produce 200 periods of a 100 kHz sine wave signal gated at 250 Hz. The signal generator may, for example, produce an output signal of 0.4 $V_{pp}$, resulting in approximately 28 mA of current that flows in the drive coil 18.

FIG. 3 is a simplified illustration of drive coil 18 and a signal generator 17 that cooperate to generate a magnetic excitation field. In this illustrative example, one or more coils are preferably arranged in the plane of the location sensor. A sinusoidal current is produced by the signal generator 17 with peak magnitude $A_1$ at radian frequency $\omega_1$ and is applied to the rectangular coil 18.

The stylus 12 is configured to collect energy from the magnetic field generated by drive coil 18/drive loop electronics 16 using a tank circuit. The tank circuit is preferably tuned to resonate at the frequency that the drive coil 18 is driven. In this illustrative example, the frequency is set at 100 kHz. The tank circuit of the stylus 12 builds amplitude during the burst produced by the drive coil 18 and then gradually loses signal amplitude after the drive coil 18 is turned off. The time associated with the exponential charging and discharging of the resonant tank circuit of the stylus 12 is determined by the capacitive and inductive elements in the tank circuit. Matching of the tank circuit's resonance frequency and the drive signal frequency is preferably accomplished using one or more of the techniques described hereinbelow.

Referring again to FIG. 1, the sensor interface electronics 20 is preferably connected to the sensor 14 via a shielded connector. The sensor interface electronics 20 includes circuitry for measuring the signal levels present on the individual traces of the sensor 14, and is typically configured to reject as much noise as possible.

As is shown in FIG. 2, an envelope detector circuit 30 of the sensor interface electronics 20 is configured to detect signals developed on individual traces of the sensor 14. The signals output by the envelope detector circuit 30 are digitized by use of analog-to-digital (A/D) converters 32. Each trace of the sensor 14 may have a dedicated A/D converter 32. Alternatively, two or more traces may share a common A/D converter 32 via a switch having a sufficient switching frequency. The envelope detector circuit 30 is configured to provide sufficient gain to make the resultant signal match the requirements of A/D converters 32. The envelope detector circuit 30 may be configured to generate a signal having the same shape as an imaginary line describing the upper bound of the sensor signal. In such a configuration, the envelope detector circuit 30 effectively transforms the 100 kHz signal into a DC or low frequency signal that is more readily digitized. The envelope detector circuit 30 preferably incorporates one or more synchronous demodulators.

A processor 22 is coupled to the drive loop electronics 16, sensor interface electronics 20, and a communications interface 24, as is shown in FIG. 1. The processor 22 coordinates the operations of drive loop electronics 16 and sensor interface electronics 20, and is configured to determine stylus/finger location and stylus status. Stylus/finger location and stylus status determinations may be made by the processor 22 using known approaches, such as those discussed in the patent references incorporated herein by reference. In one embodiment, processor 22 determines stylus/finger location and stylus status in accordance with the methodologies disclosed in commonly owned U.S. patent application Ser. No. 11/557,829, entitled "Touch Location Sensing System and Method Employing Sensor Data Fitting to a Predefined Curve," filed on Nov. 8, 2006, which is hereby incorporated herein by reference.

The location and status information computed by the processor 22 is communicated to a computer and/or display 26 via a communications interface 24. The communications interface 24 may be configured as an RS-232 or USB interface, for example. The processor 22 may be configured to drive a display 26 directly. Alternatively, a computer 28 may be coupled to the communications interface 24 and receive the location and status information from the processor 22, and drive its display. The processor 22 or computer 28 may be configured to control cursor velocity, momentum and other factors to enhance the user experience with the sensing system 11.

Figure 4:
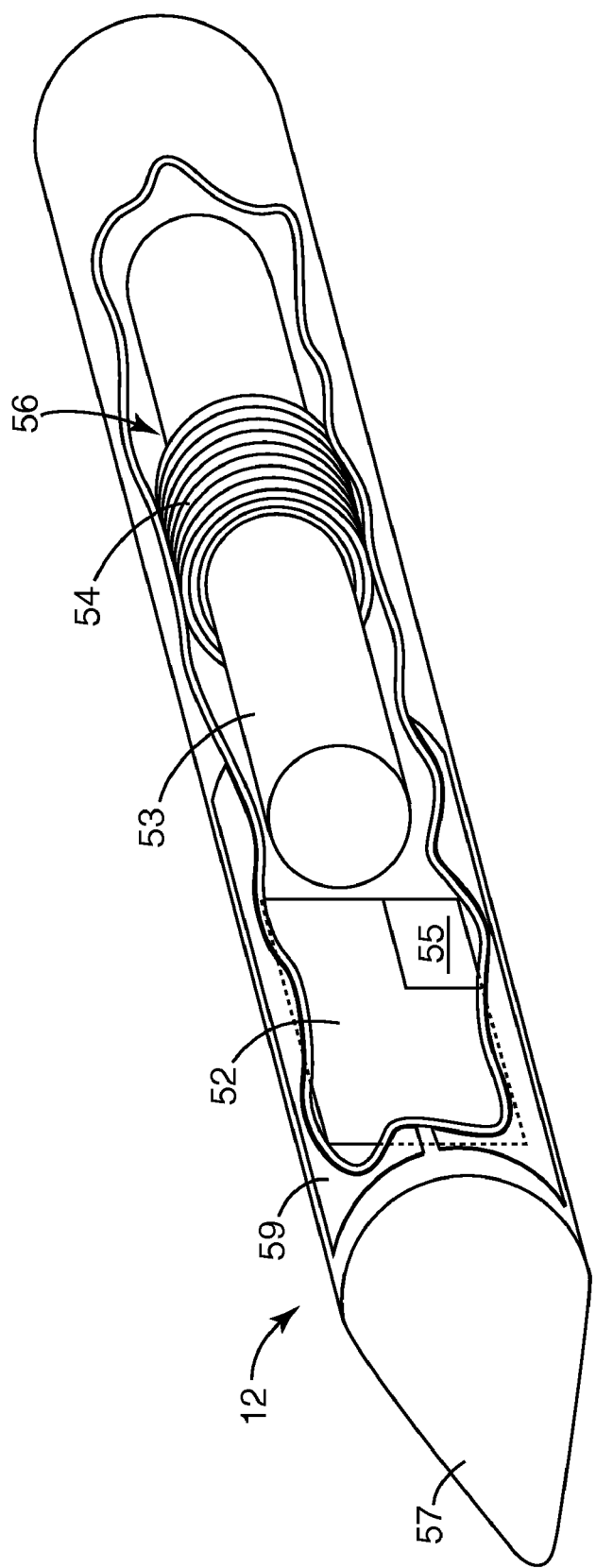
FIG. 4 is an illustration of various components of a stylus implemented in accordance with embodiments of the present invention.

Referring now to FIG. 4, there is shown an embodiment of an untethered stylus 12 of the present invention that may be implemented in the context of a location sensing system as described above or other sensing system known in the art. In accordance with the embodiment shown in FIG. 4, a stylus 12 houses electronics 52, which includes frequency sensitive LC circuitry, and a coil 54 wrapped around a ferrite cylinder 53. The ferrite cylinder 53 serves to increase signal amplitude. An applied harmonic magnetic field produced at the surface of the location sensor (e.g., digitizer) or a display, for example, couples flux through the ferrite cylinder 53 and thus to the coil 54 when the stylus 12 is placed in the applied field.

The ferrite coil arrangement 56 resonates with a separate parallel-connected capacitor of the electronics 52 and is tuned to the excitation field frequency. In various embodiments, circuitry 55 is provided in the untethered stylus 12 to provide for self-tuning of the resonance frequency of the frequency sensitive LC circuitry in accordance with one or more techniques described herein. In other embodiments, the frequency of a source voltage produced by the source device that generates the excitation field is adjusted so that the phase of an input impedance of the source device is substantially zero, thereby maximizing a voltage across the capacitor of the frequency sensitive LC circuitry of the untethered stylus 12.

The parallel coil-capacitor combination is connected between the stylus tip 57 and the stylus shield 59. The shield 59 may form part of, or otherwise be connected to, the stylus housing so that it can be touched, and therefore grounded, by a user's hand when held. The shield 59 may be situated to extend over the circuitry region of the stylus 12, and preferably has a discontinuous shape, such as a "C" shape, so as to avoid eddy currents that could otherwise arise in a closed loop shield arrangement.

The stylus tip 57 couples capacitively to the location sensor from which location information is derived. To provide stylus status information, the ferrite coil arrangement 56 powers the electronics 52 which amplitude modulates the stylus tip voltage at the reference frequency or frequencies. The frequency of the oscillations is changed to reflect the stylus status, such as switch closures or tip pressure changes.

Alternatively, the invention may be implemented with magnetic-sensing digitizer systems as are known in the art. An untethered magnetic stylus is similar to the capacitive stylus shown in FIG. 4, except the resonant circuit comprising ferrite coil arrangement 56 and separate parallel-connected capacitor of the electronics 52 need not be connected to tip 57 nor to a shield 59. Untethered magnetic styluses are well known in the art, and are described in previously incorporated U.S. Pat. Nos. 4,786,765; 5,633,471; 5,793,360; 6,667,740, and 7,019,672. Embodiments of the present invention that are implemented using an untethered magnetic stylus may employ a location sensor that includes multiple drive loops as disclosed in the referenced patents. In such embodiments, a separate sensing grid and separate drive loops need not used. Rather, each of the drive loop coils is alternately coupled to transmitting circuitry and then to receiving circuitry to alternately transmit and receive from one of multiple drive loop coils that are placed in the active area, typically under the display.

Figure 5:
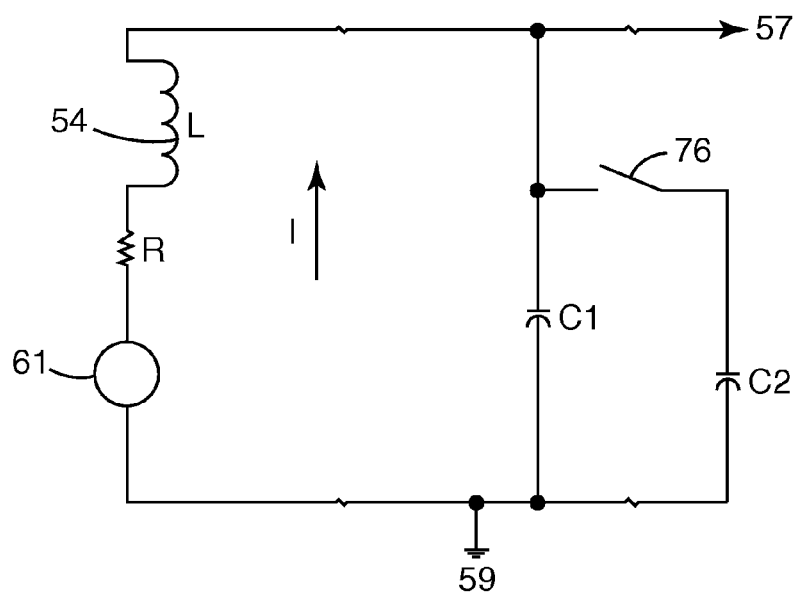
FIG. 5 shows a schematic model of a parallel coil-capacitor circuit that may be incorporated in a stylus or other device, such as an RFID tag, in accordance with embodiments of the present invention.

FIG. 5 shows a schematic model of a parallel coil-capacitor circuit that facilitates an enhanced understanding of the present invention. The parallel coil-capacitor circuit shown in FIG. 5 (i.e., tank circuit) may be incorporated in a stylus as part of, or coupled to, resonance frequency tuning circuitry in accordance with embodiments of the present invention. FIG. 5 shows a capacitor C1 connected in parallel with a coil 54 to resonate at the excitation frequency or the transmitted frequency. The voltage developed across the coil 54, which is shown modeled as voltage generator 61, is coupled to the stylus tip 57 and then capacitively coupled to the location sensor, such as sensor 14 shown in FIG. 1. The voltage developed across the resonating coil 54 is preferably modulated with one or a combination of known techniques. An added ferrite cylinder 53 about which coil 54 is preferably wrapped, as shown in FIG. 5, has the effect of increasing the magnetic flux B and signal coupled by the drive coil of the location sensor to the receiving coil 54 of the stylus 12.

The capacitance value of capacitor C1 shown in FIG. 5 is selected such that the capacitance, C, of capacitor C1 resonates with the coil inductance, L, at the excitation angular frequency $\omega$ so that there is no voltage drop across the LC combination. Two different voltages in this circuit can be considered. The first voltage of consideration is the voltage V (shown in terms of voltage source 61) that develops across the coil 54 through magnetic induction. It is well understood that this voltage 61 is basically equal to the number of stylus coil turns N times the coil cross section A times the rate of change of the magnetic flux density passing through the ferrite cylinder, which is given by $V=N*A*dB/dt$.

The second voltage of consideration is the voltage that develops across the capacitor C1. This voltage $V_C$ is also the stylus tip voltage. From basic circuit analysis at resonance, it follows that: $V_C=V/(\omega RC)=V(\omega L/R)$ with the quantity $1/(\omega RC)=(L\omega)/R$ defined as the resonant circuit quality factor Q, where $\omega$ is expressed in terms of radians per second. This second voltage may be modulated for purposes of communicating stylus status data to a location sensor.

With continued reference to FIG. 5, one approach to transmitting stylus status information in addition to stylus position information is through addition of a second capacitor C2 connected to the first capacitor C1 through a switch 16. Opening and closing the switch 16 causes the resonance frequency of the coil-capacitor combination 54/C1 to change. This change may be detected by observing a change in phase of the stylus transmitted frequency or though a transient frequency change caused when the drive coil current is turned off.

This method of data transmission, however, is not suitable for a stylus powered by a constantly varying magnetic field and capacitively coupled to the digitizer. Constant excitation does not allow a transient measurement of the stylus resonance, and phase modulation is difficult to detect as the phase of the digitizer received signal varies dramatically as the stylus is moved across the location sensor (e.g., digitizer). Frequency modulation of an amplitude-modulated signal using multiple reference frequencies generated at the stylus, for example, removes these difficulties. The location sensor may be configured to demodulate the amplitude modulation and detect the reference frequencies of the modulation.

Figure 6:
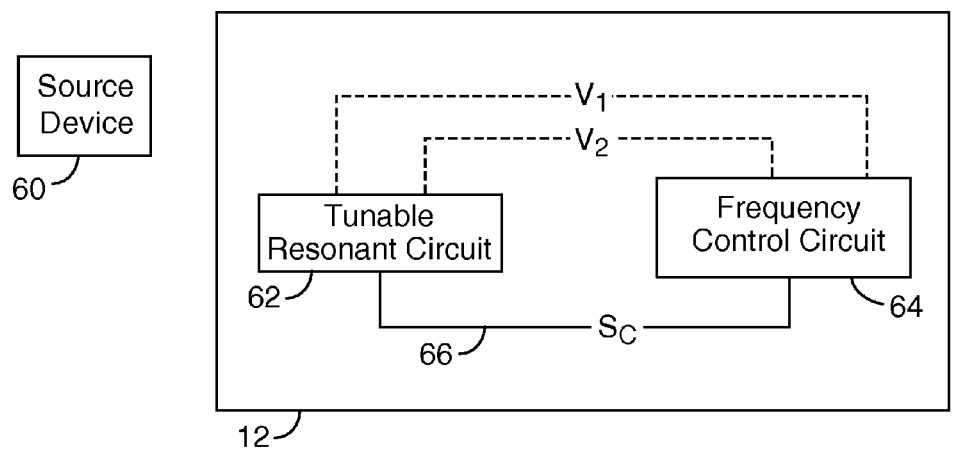
FIG. 6 is a block diagram of one illustrative implementation that provides for continuous tuning of resonant circuitry of an untethered device, such as a stylus or RFID tag, in accordance with embodiments of the present invention.

FIG. 6 is a block diagram of one illustrative implementation that provides for continuous tuning of resonant circuitry of an untethered device 12, such as a stylus or RFID tag. According to this illustrative embodiment, the untethered device 12 implements a method of extracting an error control signal that can be used in a feedback mechanism to self-tune the resonance frequency of LC circuitry of the untethered device 12.

According to the implementation shown in FIG. 6, an untethered device 12 includes a tunable resonant circuit 62, which includes inductive and capacitive circuit components. The tunable resonant circuit 62 has a resonance frequency that can be continuously adjusted to match the frequency of the source device 60. The source device 60 typically generates a varying magnetic field having a fixed frequency.

The untethered device 12 is further shown to include a frequency control circuit 64, which is coupled to the tunable resonant circuit 62 via a control line 66. The frequency control circuit 64 is configured to produce a control signal, $S_C$, using signals developed within the tunable resonant circuit 62. In this illustrative example, voltage signals $V_1$ and $V_2$, developed within the tunable resonant circuit 62, are extracted for use in tuning the tunable resonant circuit 62. The control signal, $S_C$, generated by the frequency control circuit 64, is useable to adjust the resonance frequency of the tunable resonant circuit 62 to match the fixed frequency of the source device 60.

Figure 7:
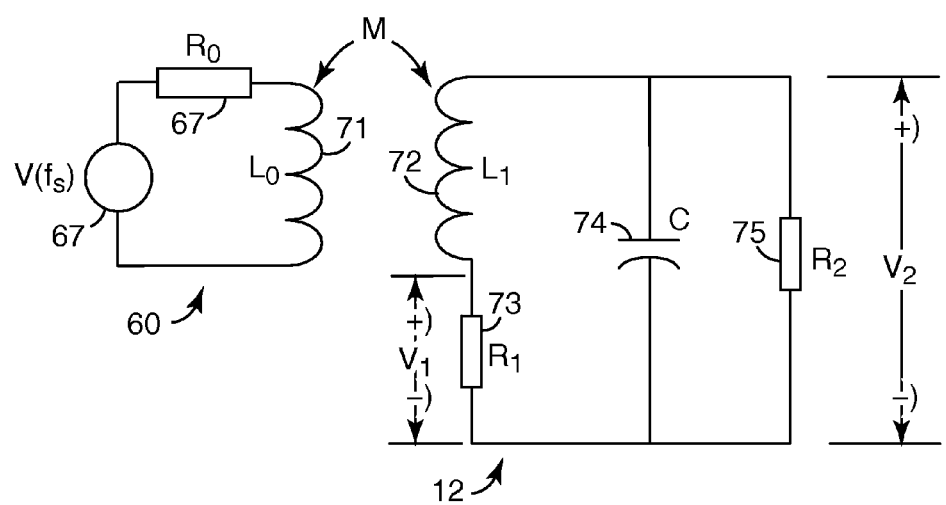
FIG. 7 is a schematic of circuitry of a source device and an untethered device in accordance with embodiments of the present invention.

Turning now to FIG. 7, there is shown a schematic of circuitry of a source device 60 and an untethered device 12 in accordance with embodiments of the present invention. In configurations in which the untethered device 12 is implemented as an RFID tag, the $L_1$-C circuit 72, 74 is referred to as the "tag," while the $L_0$ inductance component 71 is part of a "reader," with fixed frequency $f_s$. It is understood that the circuitry shown in FIG. 7 and in other Figures may be employed in systems and devices other than those that employ untethered styli and RFID tags.

In conventional implementations, the components $L_1$ 72 and C 74 are fixed, such that the resonance frequency, $f_{res}$, of the $L_1$-C combination 72, 74 is defined as:

$$f_{res} = \frac{1}{2\pi\sqrt{L_1 C}}$$

The resonance frequency, $f_{res}$, of the $L_1$-C combination 72, 74 is not exactly equal to the source frequency, $f_s$. As a result, the voltage $V_2$ that develops across the capacitor C 74 is lower than desired. Because this voltage, $V_2$, is often used to power additional circuitry or communication electronics, a reduced voltage across the capacitor C 74 results in suboptimal performance. A tunable resonant circuit with frequency control in accordance with the present invention provides an improvement in performance, in that $L_1$ 72, C 74 or both may be automatically and continuously tuned so that the resonance frequency, $f_{res}$, of the $L_1$-C combination 72, 74 becomes exactly equal to the frequency, $f_s$, of the source device 60.

Defining the angular resonance frequency $\omega_{res}=2\pi f_{res}$ and applying Kirchoff's laws to the circuit in FIG. 7 leads to the following:

$$\frac{V_2}{V_1} = \frac{(\omega^2 - \omega_{res}^2)}{\omega_{res}^2} \frac{R_2}{R_1} - j\omega R_2 C$$

so that the phase angle, $\phi$ between $V_1$ and $V_2$ is given by:

$$\varphi = \arctan\frac{\omega_{res}^2}{\omega_{res}^2 - \omega^2}\omega R_1 C = \arctan\frac{2\pi f R_1 C}{(1-(f/f_{res})^2)}$$

Voltage signals $V_1$ and $V_2$ developed as shown in FIG. 7 are preferably fed to a frequency control circuit, a general embodiment of which is shown in FIG. 6. Using the voltage signals $V_1$ and $V_2$ as inputs, the frequency control circuit produces a control signal that is fed back to the resonant circuitry which, in response, results in adjustment of the resonance frequency of the untethered device 12 to match the frequency of the source voltage produced by the source device 60.

In general, the control signal generated by the frequency control circuit is preferably a signal that is proportional to the voltage signals $V_1$ and $V_2$. The control signal may also be a signal that is proportional to the voltage signal $V_2$. According to one approach, the control signal is preferably produced by a multiplication of the voltage signals $V_1$ and $V_2$. If $V_1$ and $V_2$ are harmonic and have the same frequency but a phase shift of $\phi$, as defined above, the multiplication results in the following:

$$V_{out} = V_1 \cos\omega t * V_2 \cos(\omega t - \varphi)$$

$$= \frac{V_1 V_2}{2}\{\cos\varphi + \cos(2\omega t - \varphi)\}$$

The first term in the brackets of the resultant equation, cos $\phi$, is the desired control signal component. The second term, $\cos(2\phi t-\phi)$, is a double frequency signal component that is undesirable. This second term is preferably filtered out of the control signal, which, after filtering, can be represented as $V_c$ cos $\phi$. Those skilled in the art will appreciate that various known techniques used in a variety of mixing and superheterodyning applications may be employed to extract a control signal usable to adjust the resonance frequency of the tunable resonant circuit of the untethered device 12 to match the fixed frequency of the source device 60 in accordance with the present invention.

Figure 8:
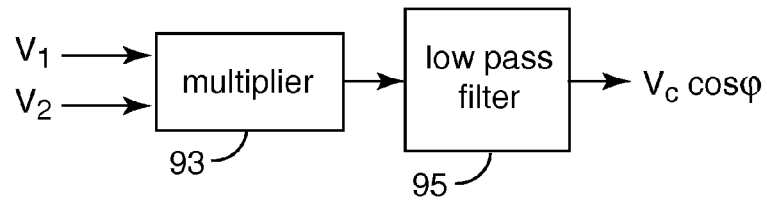
FIG. 8 is a block diagram of a frequency control circuit in accordance with embodiments of the present invention.

FIG. 8 is a diagram of one implementation of a frequency control circuit in accordance with embodiments of the present invention. The frequency control circuit shown in FIG. 8 includes a multiplier 93 coupled to a low pass filter 95. The voltage signals $V_1$ and $V_2$, such as those shown in FIGS. 6 and 7, are fed into the multiplier 93. The output of the multiplier 93, $V_{out}$, is a voltage signal produced by a direct multiplication of $V_1$ and $V_2$, such that $V_{out}=V_1*V_2$.

As discussed above, if $V_1$ and $V_2$ are harmonic and have the same frequency but a phase shift of $\phi$, then $V_{out}$ is calculated according to the equation above. This signal, $V_{out}$, is then fed to the low pass filter 95, which may be configured to filter out the double frequency signal component discussed above or to simply pass only a DC signal. The output of low pass filter 95 is the control signal $V_c$ cos $\phi$. It is noted that both $V_1$ and $V_2$ will not vanish near the resonance frequency, $f_{res}$, of the untethered device's tunable resonant circuit, so that $V_c$ will always have an acceptable amplitude.

In low frequency applications (e.g., <1 MHz), the multiplier 93 may include an analog multiplier chip, such as a four-quadrant analog multiplier model AD633 available from Analog Devices, Inc. For high frequency applications (i.e., >1 MHz), any suitable mixer may be used.

Figure 9:
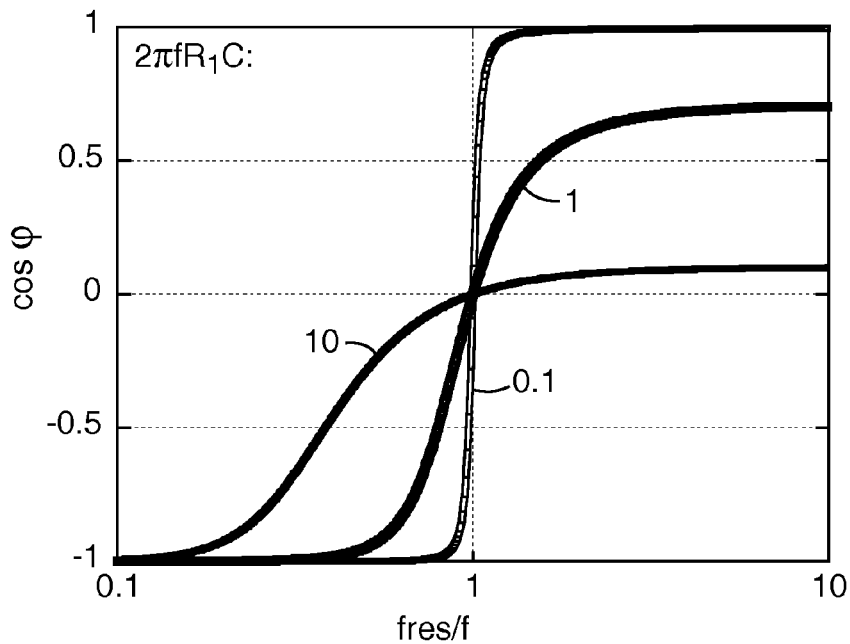
FIG. 9 is a plot of cos $\phi$ versus normalized resonance frequency $f_{res}/f_s$ for different $R_1C$ time constants in connection with the circuitry shown in FIG. 7, the plot of FIG. 9 showing a desired zero value at the imposed source frequency $f_s$ in accordance with embodiments of the present invention.

FIG. 9 is a plot of cos φ versus normalized resonance frequency $f_{res}/f_s$ for different $R_1C$ time constants in connection with the frequency control circuit shown in FIG. 8. The plot of FIG. 9 clearly shows a desired zero value at the imposed source frequency $f_s$. Thus, the signal $V_c \cos \phi$ can be used as a control signal to force the $L_1$-C circuit shown in FIG. 7 to adjust $f_{res}$ to become equal to $f_s$ through a feedback mechanism. FIG. 9 shows that the dynamic range of cos φ is greater for smaller values of $R_1$ and C. A small value of $R_1$ is consistent with the requirement that the resonance circuit has a high Q value.

Figure 10:
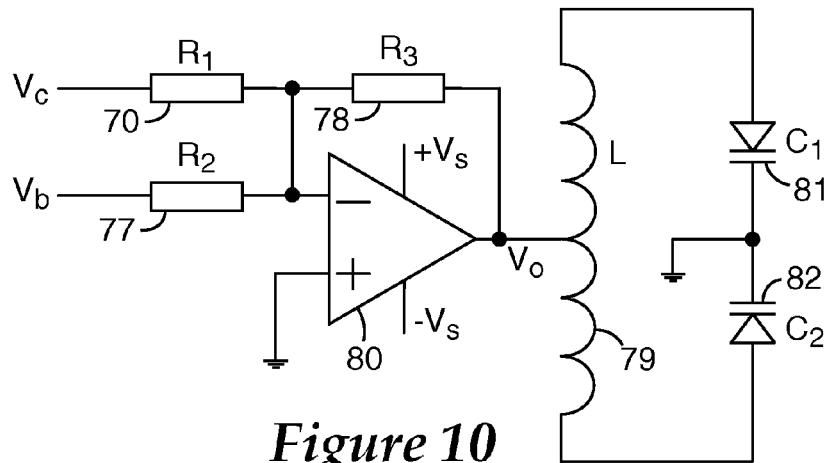
FIG. 10 is a schematic of circuitry for controlling the resonance frequency of inductive-capacitive (LC) circuitry of an untethered device in accordance with embodiments of the present invention.

FIG. 10 is a schematic of circuitry for controlling the resonance frequency of LC circuitry of an untethered device in accordance with other embodiments of the present invention. Control circuitry implemented in accordance with embodiments encompassed by FIG. 10 provides for controlling the resonance frequency of LC circuitry of an untethered device using a control voltage that changes the capacitance, C, of the LC circuitry.

It is understood by those skilled in the art that inductances (L) and capacitances (C), as well as other factors, influence the resonance frequency of a circuit made up of these components. For high quality circuits, for example, resonance frequency variation can be very sensitive for even slightly different component values. To avoid time consuming and thus expensive manual tuning of component values, and to avoid subsequent detuning because of slowly changing conditions, an automatic mechanism using feedback in accordance with embodiments of the present invention provides for precise continuous tuning of the capacitor value, C, to ensure optimal circuit performance.

FIG. 10 shows one configuration of a voltage controlled resonance frequency LC circuit in accordance with embodiments of the present invention. In the implementation shown in FIG. 10, a coil 79 represents an inductance L of the circuit, and $C_1$ 81 and $C_2$ 82 are varactor diodes that are always driven in reverse so that they behave as capacitances. An output of an OPAMP 80 is shown coupled to the center tap of the coil 79. In this arrangement, the OPAMP output voltage as the center tap voltage for coil 79 placed both varactor diodes 81, 82 in reverse bias with the same voltage, so that both $V_b$ and $V_c$ can control the resonance frequency of the L, $C_1$, $C_2$ combination.

The bias voltage, $V_b$, is essentially DC and the control voltage, $V_c$ is at most slowly varying compared to the resonance frequency of the LC circuit. The OPAMP output voltage, $V_o$, is given by:

$$V_o = -\frac{R_3}{R_1}V_c - \frac{R_3}{R_2}V_b$$

Demanding that varactor diodes $C_1$ 81 and $C_2$ 82 are always driven in reverse or that the OPAMP output voltage, $V_o$, is always negative, as given below:

$$-V_s < V_o < 0$$

results in the following allowed operating range for the control voltage, $V_c$:

$$-\frac{R_1}{R_2}V_b < V_c < \frac{R_1}{R_3}V_s - \frac{R_1}{R_2}V_b$$

When $R_1$ 70=$R_2$ 77=$R_3$ 78, and with $V_b$=0.5 $V_s$, the control voltage, $V_c$, has the following desirable range:

$$-\frac{V_s}{2} < V_c < \frac{V_s}{2}$$

Because of the anti-series arrangement of the varactor diodes $C_1$ 81 and $C_2$ 82, an external alternating flux that is coupled by coil 79 will induce a voltage over coil 79 that will cause varactor diode $C_1$ 81 to be driven less in reverse and varactor diode $C_2$ 82 more in reverse. Assuming a linear varactor capacitance-voltage dependence $\Delta C = k\Delta V$, this means that varactor diode $C_1$ 81 undergoes a capacitance change $+\Delta C$ whereas varactor diode $C_2$ 82 undergoes a $-\Delta C$ change. With $C_1=C_2=C$, the total capacitance, $C_t$, formed by $C_1$ 81 and $C_2$ 82 is then given by:

$$\frac{1}{C_t} = \frac{1}{C+\Delta C} + \frac{1}{C-\Delta C}$$

so that:

$$C_t = \frac{C}{2} - \frac{(k\Delta V)^2}{2C}$$

meaning that the total capacitance, $C_t$, is virtually AC voltage amplitude independent, except for a second order effect.

In one implementation, a total of 8 varactor diodes as 2 groups of 4 parallel diodes may be used to form $C_1$ 81 and $C_2$ 82. A ferrite containing self-inductance (L) coil 79 of 22 mH may be used so that the total capacitance, $C_t=C_1C_2/(C_1+C_2)$, at $V_b$=7.5 V and $V_c$=0 V is estimated to be about 115 pF. Therefore, $C_1$ 81 and $C_2$ 82 each have a capacitance of approximately 230 pF. The sensitivity for such an implementation is around 1 kHz/V.

The circuit in FIG. 10 may be implemented using silicon varactor diodes, such as MVAM115 silicon varactor diodes available from Advanced Semiconductor, Inc. OPAMP 80 is preferably a low noise OPAMP, such as OP27 Low Noise, Precision Operational Amplifier available from Analog Devices, Inc.

Figure 11:
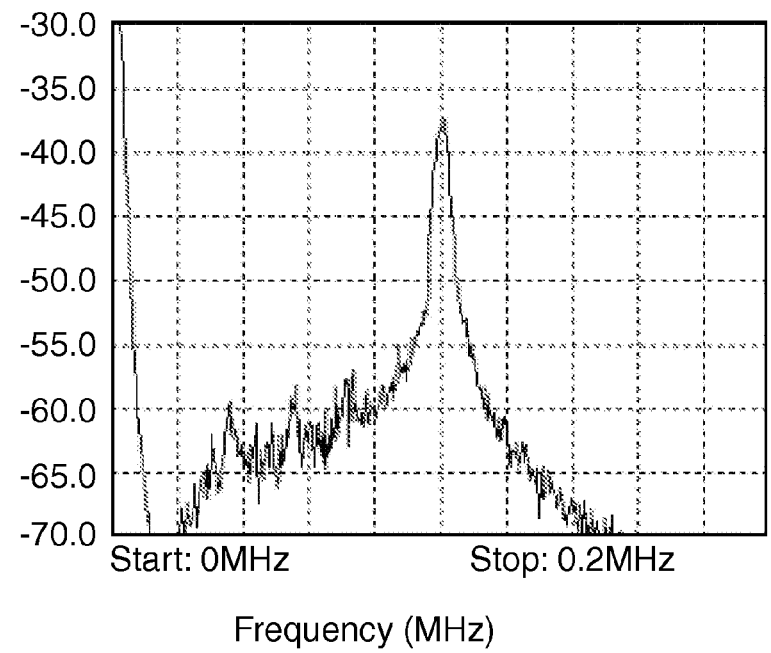
FIGS. 11 and 12 show the results of changing a control voltage, $V_c$, on the resonance frequency of LC circuitry shown in FIG. 10.
Figure 12:
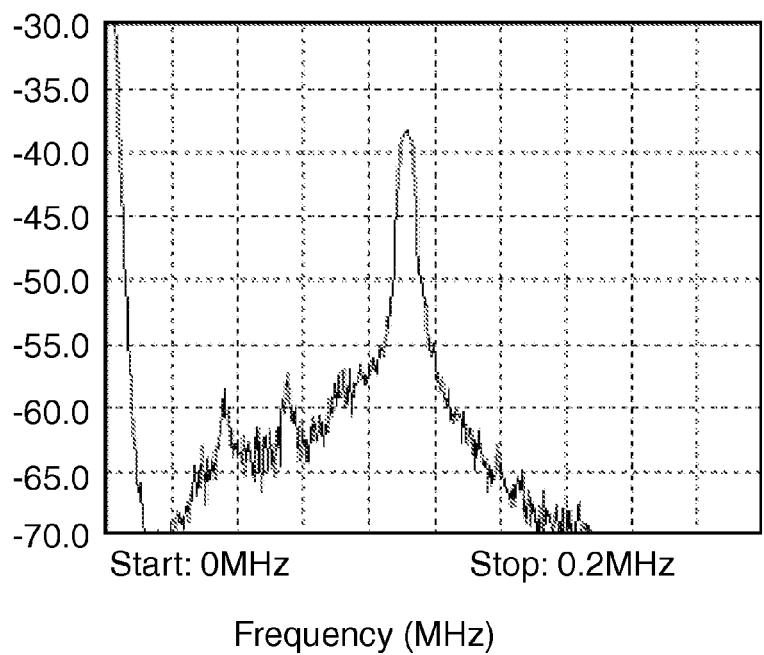

FIGS. 11 and 12 show the results of changing control voltage, $V_c$, on the resonance frequency. FIG. 11 shows a resonance peak for $V_c$=0 volt, at a resonance frequency≈100 kHz. FIG. 12 shows a resonance peak for $V_c$=5 volt, at a resonance frequency≈95 kHz. The frequency spectra in FIGS. 11 and 12 were obtained by inductively inducing a white spectrum into coil 79 and measuring the LC circuit response after changing $V_c$.

Figure 13:
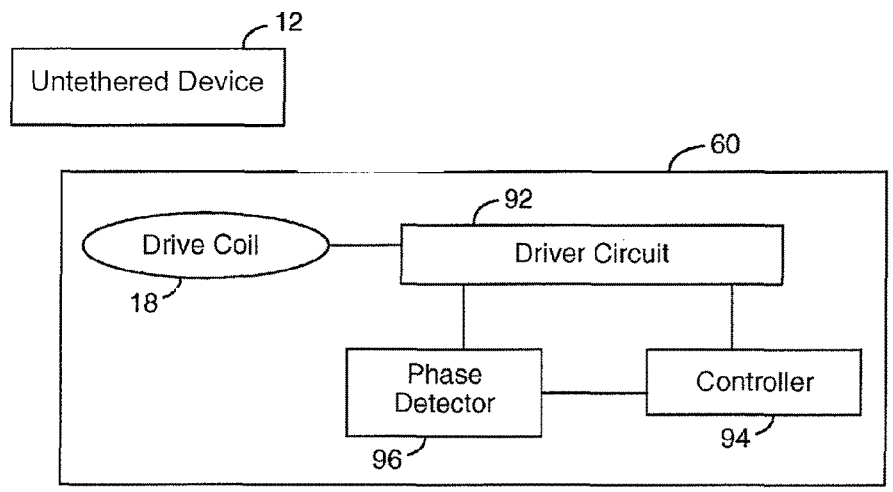
FIG. 13 is a block diagram of components that provide for self-tuning of the frequency of a drive source that inductively couples to an LC circuit of an untethered device, such as a stylus or RFID tag, in accordance with embodiments of the present invention.

Further embodiments of the present invention are directed to self-tuning the frequency of a drive source that inductively couples to an LC circuit of an untethered device, such as a stylus or RFID tag, so that a maximum voltage develops over the capacitor, C, in the LC circuit. FIG. 13 illustrates an implementation of one such embodiment, in which a source device 60 inductively couples to an LC circuit in an untethered device 12. The source device 60 is shown to include a driver circuit 92 coupled to drive coil 18, which may include one or more coils. The driver circuit 92 may be implemented as part of the drive loop electronics 16 shown in FIG. 1.

Also shown in FIG. 13 is a phase detector 96 coupled to the driver circuit 92, the driver circuit 92 further including a drive coil circuit. A controller 94 is coupled to the phase detector 96 and the driver circuit 92. The controller 94 may be part of, or coupled to, the processor 22 shown in FIGS. 1 and 2.

In operation, the driver circuit 92 and drive coil 18 cooperate to generate a varying magnetic field. The phase detector 96 detects a phase of an input impedance of the driver circuit 92 in response to the source device 60 inductively coupling with the LC circuit of the untethered device 12. The controller 94 adjusts a frequency of a source voltage applied to the driver circuit 92 in response to an output signal of the phase detector 96. The controller 94, which may be implemented using a voltage controlled oscillator, adjusts the source voltage frequency so that the phase of the input impedance as indicated by the output signal of the phase detector 96 is substantially zero. In this manner, controller adjustment of the source voltage frequency compensates for a change in the resonance frequency, or a parameter of the resonance frequency, of the resonant LC circuit of the untethered device 12.

Figure 14:
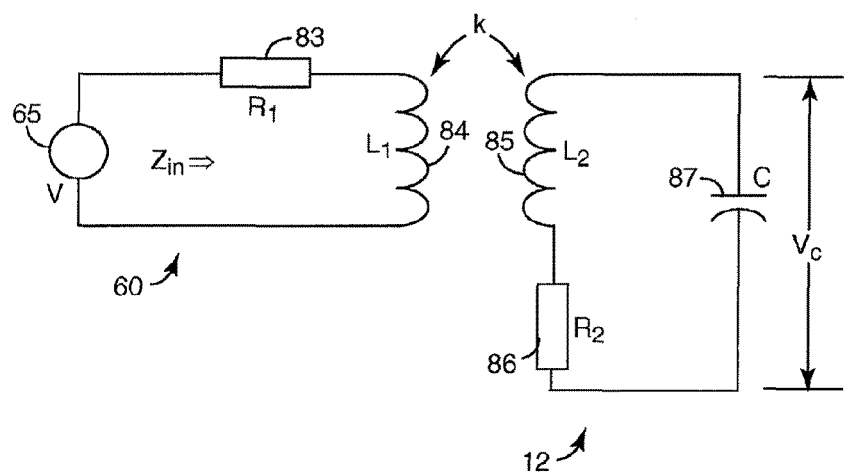
FIG. 14 is a schematic of circuitry that may be incorporated in the source device and untethered device shown in FIG. 13.

FIG. 14 is a schematic of circuitry that may be incorporated in the source device 60 and untethered device 12 shown in FIG. 13. FIG. 14 shows the source device 60 inductively coupled to an LC resonance circuit of the untethered device 12. The frequency matching methodology according to this embodiment involves detecting the phase of the source device's input impedance, $Z_{in}$ (looking into the drive coil 84 ($L_1$)), such as by use of a phase detector, and adjusting the frequency of the source voltage V 65 until that phase is zero. The output of the phase detector can then be used in a feedback circuit to drive a voltage controlled oscillator (VCO), for example, with V as an output signal.

A variety of available phase detectors may be used to perform phase detection and comparison. In low frequency applications (i.e. <1 MHz), for example, an analog multiplier, such as the aforementioned AD633, may be used. In higher frequency applications (i.e., >1 MHz), a passive component, such as a PDP-201 Phase Detector available from Synergy Microwave Corporation, may be used for phase detection. Other commercial components and implementation may be used that provide similar functionality and performance.

The following analysis is provided with reference to FIG. 14. With sufficient coupling k, the phase of $Z_{in}$ is zero at the frequency that corresponds with the maximum voltage $V_c$. Applying Kirchoff's laws to the circuit in FIG. 14 leads to:

$$\frac{V_c}{V} = \frac{1}{C} \cdot \frac{k\sqrt{L_1 L_2}}{(R_1 + j\omega L_1)\left(R_2 + j\omega L_2 - \frac{j}{\omega C}\right) + \omega^2 k^2 L_1 L_2} \quad [1]$$

with ω angular frequency, whereas $Z_{in}$ is given by:

$$Z_{in} = R_1 + j\omega L_1 + \frac{k^2 \omega^2 L_1 L_2}{R_2 + j\omega L_2 - \frac{j}{\omega C}} \quad [2]$$

Figure 15:
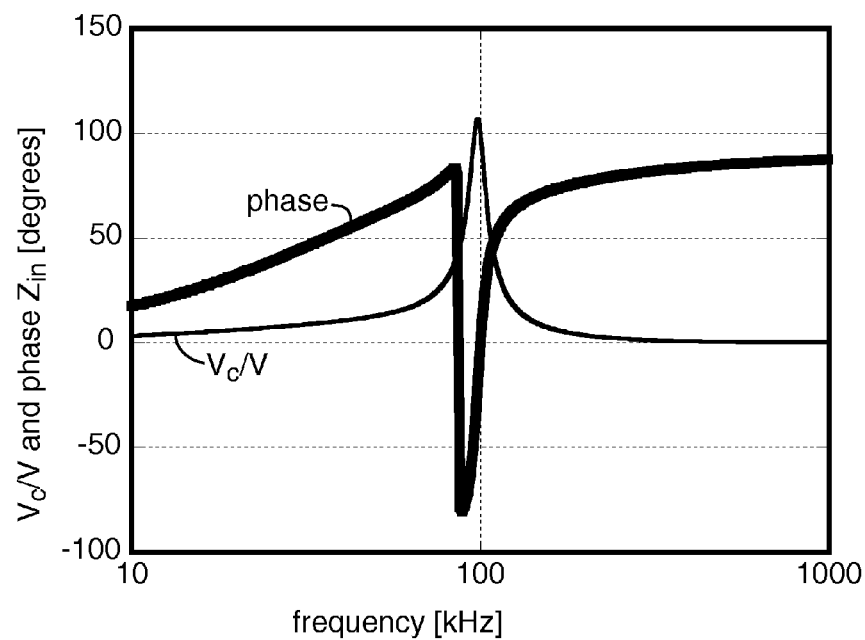
FIG. 15 is a plot of capacitor voltage and input impedance phase as a function of frequency in connection with the circuitry depicted in FIGS. 13 and 14.

FIG. 15 is a plot of capacitor voltage and input impedance phase as a function of frequency. More particularly, FIG. 15 is a plot of the voltage ratio $V_c/V$ of equation [1] and phase, $Z_{in}$, of equation [2] for the following values of the components shown in FIG. 14: $L_1$=45 μH, $L_2$=22 mH, $R_1$=9Ω, $R_2$=40Ω, C 87=153.5 pF, and k=0.5. As is clear in FIG. 15, the capacitor voltage, $V_c$, is maximum near the higher frequency point where the phase of the input impedance, $Z_{in}$, is zero.

Figure 16:
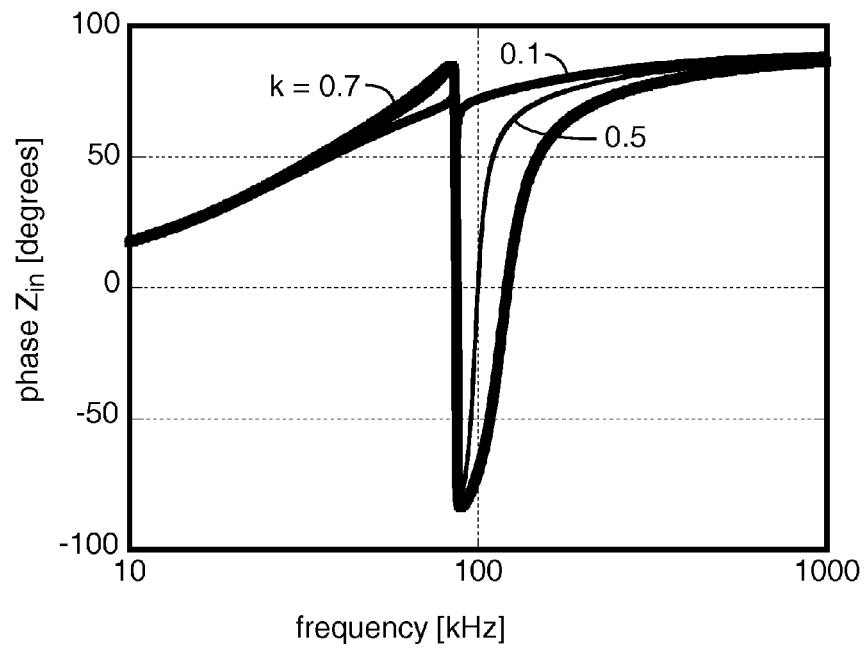
FIG. 16 is a plot of the phase of source device input impedance, $Z_{in}$, for different values of k in connection with the circuitry depicted in FIGS. 13 and 14.

The source frequency self-tuning methodology described above works well for strong coupling or high values of k, where k takes on values between 0 and 1 (i.e., 0<k<1). FIG. 16 gives an indication of the phase of $Z_{in}$ for different values of k. It can be seen from FIG. 16 that the detection mechanism breaks down when k gets too small because the phase of $Z_{in}$ no longer goes through zero. The fact that the phase of $Z_{in}$ for k=0.1 fails to go through zero in FIG. 16 may not be entirely obvious, but this fact can easily be confirmed by reproducing the graph depicted in FIG. 16 using Equation [2] above.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An untethered device configured to inductively couple to a source device, the source device configured to generate a varying magnetic field having a fixed frequency, the untethered device comprising:
   a tunable resonant circuit having a resonance frequency and configured to generate a supply voltage for the untethered device in response to the varying magnetic field, the tunable resonant circuit including
      an inductive coil comprising a center tap; and
      a capacitive circuit coupled to the inductive coil, the capacitive circuit comprising an anti-series arrangement of varactor diodes that set a capacitance when placed in reverse bias; and
   a frequency control circuit coupled to the tunable resonant circuit, the frequency control circuit comprising a control voltage source coupled to the center tap of the inductive coil, the control voltage source producing a control signal to place the varactor diodes in reverse bias and to change the capacitance of the capacitive circuit, thereby effecting a change in the resonance frequency of the tunable resonant circuit.

2. The device of claim 1, wherein the inductive coil comprise first and second contacts at respective first and second ends of the inductive coil, a first varactor diode arrangement coupled between the first end of the inductive coil and ground, and a second varactor diode arrangement coupled between the second end of the inductive coil and ground.

3. The device of claim 1, wherein the anti-series arrangement of varactor diodes provides for a total capacitance, $C_t$, that is substantially AC voltage amplitude independent except for a second order effect.

4. The device of claim 1, wherein the control signal produced by the control voltage source changes the capacitance of the capacitive circuit so that the resonance frequency of the tunable resonant circuit is tuned to the fixed frequency of the magnetic field.

5. The device of claim 1, wherein the source device comprises an RFID (radio frequency identification) reader and the untethered device comprises an RFID tag.

6. The device of claim 1, wherein the source device comprises a digitizer and the untethered device comprises a stylus.

7. An untethered device configured to inductively couple to a source device, the source device configured to generate a varying magnetic field having a fixed frequency, the untethered device comprising:
- a tunable resonant circuit having a resonance frequency and configured to generate a supply voltage for the untethered device in response to the varying magnetic field, the tunable resonant circuit including:
  - an inductive coil comprising a center tap;
  - a capacitive circuit coupled to the inductive coil, the capacitive circuit comprising an anti-series arrangement of varactor diodes that set a capacitance when placed in reverse bias;
- a frequency control circuit coupled to the tunable resonant circuit, the frequency control circuit comprising a control voltage source coupled to the center tap of the inductive coil, the control voltage source producing a control signal to place the varactor diodes in reverse bias and to change the capacitance of the capacitive circuit, thereby effecting a change in the resonance frequency of the tunable resonant circuit; and wherein the control voltage source comprises an operational amplifier having a negative input, a positive input, and an output, the output of the operational amplifier coupled to the center tap of the inductive coil.

8. The device of claim 7, wherein the positive input of the operational amplifier is coupled to ground, and the negative input of the operational amplifier is coupled to voltage source circuitry.

9. The device of claim 7, wherein the positive input of the operational amplifier is coupled to ground, and the negative input of the operational amplifier is coupled to a first voltage source and a second voltage source, the first voltage source providing a bias voltage and the second voltage source providing a slowly varying AC voltage relative to the resonance frequency of the tunable resonant circuit.

10. A method implemented in an untethered device configured to inductively couple to a source device, the source device configured to generate a varying magnetic field having a fixed frequency, the method comprising:
- generating, by a tunable resonant circuit of the untethered device, a supply voltage for the untethered device in response to the varying magnetic field, the tunable resonant circuit comprising an inductive coil coupled to a capacitive circuit, the capacitive circuit comprising an anti-series arrangement of varactor diodes that behave as a capacitance when placed in reverse bias; and
- producing a control signal and applying the control signal to a center tap of the inductive coil to place the varactor diodes in reverse bias and to change the capacitance of the capacitive circuit, thereby effecting a change in the resonance frequency of the tunable resonant circuit.

11. The method of claim 10, wherein producing the control signal comprises receiving first and second voltage signals and producing the control signal using the first and second voltage signals.

12. The method of claim 11, wherein the first voltage signal comprises a bias voltage and the second voltage signal comprises a slowly varying AC voltage relative to the resonance frequency of the tunable resonant circuit.

13. The method of claim 10, wherein the anti-series arrangement of varactor diodes provides for a total capacitance, $C_t$, that is substantially AC voltage amplitude independent except for a second order effect.

14. The method of claim 10, comprising changing the capacitance of the capacitive circuit using the control signal.

15. The method of claim 10, comprising changing the capacitance of the capacitive circuit using the control signal so that the resonance frequency of the tunable resonant circuit is tuned to the fixed frequency of the magnetic field.

16. The method of claim 10, wherein the source device comprises an RFID (radio frequency identification) reader and the untethered device comprises an RFID tag.

17. The method of claim 10, wherein the source device comprises a digitizer and the untethered device comprises a stylus.

* * * * *

UNITED STATES PATENT AND TRADEMARK OFFICE
CERTIFICATE OF CORRECTION

Page 1 of 1

PATENT NO.        : 8,040,329 B2
APPLICATION NO.   : 11/613554
DATED             : October 18, 2011
INVENTOR(S)       : Martin J Vos It is certified that error appears in the above-identified patent and that said Letters Patent is hereby corrected as shown below:

On the Title Page:

Item (56), References Cited, U. S. Patent Documents,
    delete "4,848,469" and insert -- 4,848,496 -- therefor.

In the Specifications:
Column 10

Line 40; delete "$\cos(2\varphi t-\varphi)$" and insert -- $\cos(2\omega t-\varphi)$ -- therefor.

Signed and Sealed this
Twentieth Day of December, 2011

David J. Kappos
*Director of the United States Patent and Trademark Office*